United States Patent [19]

Aigo

[11] 4,447,716

[45] May 8, 1984

[54] INFORMATION CARD

[76] Inventor: Seiichiro Aigo, 3-15-13, Negishi, Daito-ku, Tokyo, Japan

[21] Appl. No.: 353,252

[22] Filed: Mar. 1, 1982

[51] Int. Cl.³ .................................................. G06K 19/06
[52] U.S. Cl. ................................... 235/492; 235/487; 235/441; 357/84
[58] Field of Search ............... 235/492, 493, 487, 441, 235/380, 382; 357/79, 84; 194/4 F

[56] References Cited

U.S. PATENT DOCUMENTS

| | | | |
|---|---|---|---|
| 3,541,480 | 9/1968 | Tenenholtz | 333/98 |
| 3,941,928 | 3/1976 | Gaind | 178/7.8 |
| 4,107,555 | 8/1978 | Haas et al. | 307/308 |
| 4,361,756 | 11/1982 | Parmentier | 235/487 |

FOREIGN PATENT DOCUMENTS 55-153355  11/1980  Japan .................................. 357/84

Primary Examiner—A. D. Pellinen
Assistant Examiner—Robert Lev
Attorney, Agent, or Firm—McGlew and Tuttle

[57] ABSTRACT

Disclosed herein is an information card, which includes a metallic casing and at least one semiconductor chip seated in the metallic casing. A conductor strip, which extends from each of contacts of the semiconductor chip, is disposed in such a way that it can be brought into contact with a signal input/output terminal of a separate signal input/output unit. An elastic magnetic member is provided in a cavity of the metallic casing at a location corresponding to each conductor strip. The elastic magnetic member is fixed at one end thereof on the metallic casing. The free end of the elastic magnetic member is kept in contact with its corresponding conductor strip while the information card is unused. However, the elastic magnetic member is attracted by a magnet in the signal input/output unit to cause its free end to separate from its corresponding conductor strip when the information card is used. Thus, when the information card is not in use, all the conductor strips are connected together through the metallic casing and thus maintained at the same potential, thereby protecting the semiconductor chip from electrostatic breakdown.

10 Claims, 7 Drawing Figures

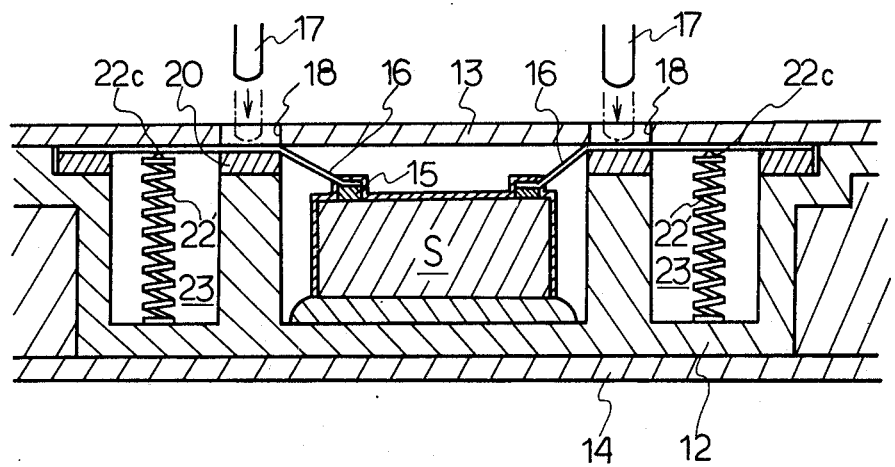

INFORMATION CARD

BACKGROUND OF THE INVENTION

1. Field of the Invention

This invention relates to an improvement in or relating to an information card such as cash card, which is adapted to identify an individual or organization in accordance with security code information such as a combination of numbers, letters and/or the like to be input from the exterior and to store an input signal or process the input signal by a semiconductor device built in the card and store the thus-processed information therein or to generate an output signal in response to the input signal.

2. Detailed Description of the Invention

Microprocessors, non-volatile momories and the like devices are incorporated in information cards of the above type. MOS-type semiconductor chips are in many instances used as their semiconductor chips. However, an MOS-type semiconductor chip is accompanied by a drawback that it is very susceptible to electrostatic breakdown. Thus, such an information card has involved a problem that a semiconductor device or semiconductor devices built in the card are damaged by, for example, rubbing the card with clothing, thereby rendering the card unsuitable for actual use.

SUMMARY OF THE INVENTION

This invention contemplates a solution to the above problem of the prior art information cards. Accordingly, an object of this invention is to provide an information card whose built-in semiconductor chips are safely protected from electrostatic breakdown.

To achieve the above object of this invention, an information card according to this invention features that each of conductor strips extending from their corresponding contacts of each semiconductor chip contained in the card makes up an independent circuit with its corresponding signal input/output terminal when the conductor strip is brought into contact with the corresponding signal input/output terminal, but, when the information card is not used, the conductor strips are electrically connected with a metallic casing through their respective elastic magnetic members, whereby being mutually connected.

Thus, in one aspect of this invention, there is provided an information card adapted to identify an individual or organization in accordance with security code information or to generate an output signal in response to an input signal or to provide like functions. The card includes a metallic casing disposed in an opening, which is formed in said card, and at least one semiconductor chip seated in said metallic casing. A conductor strip extending from each of the contacts of the semiconductor chip is disposed in such a way that it can be brought into contact with a signal input/output terminal of a separate signal input/output unit. The information card further comprises an elastic magnetic member provided in a cavity of said metallic casing at a location corresponding to the conductor strip and fixedly secured to said metallic casing at one end thereof. The free end of said elastic magnetic member is kept in contact with its corresponding conductor strip while said information card is unused. However, the elastic magnetic member is attracted by a magnet in the signal input/output unit to cause its free end to separate from its corresponding conductor strip when said information card is used.

The above and other objects, features and advantages of the present invention will become apparent from the following description and the appended claims, taken in conjunction with the accompanying drawings.

BRIEF DESCRIPTION OF THE DRAWINGS

FIG. 7 is a cross-sectional view similar to that shown in FIG. 4 but illustrates a still further embodiment of this invention.

DETAILED DESCRIPTION OF THE INVENTION AND PREFERRED EMBODIMENTS

Figure 1:
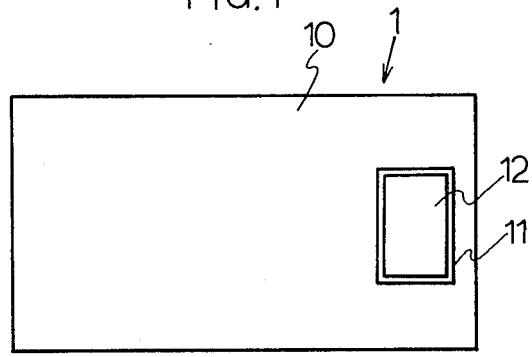
FIG. 1 is a plan view of an information card to which this invention relates.
Figure 2:
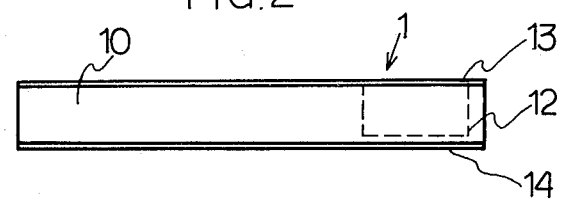
FIG. 2 is a side view of the information card.

Referring now to the accompanying drawings, certain preferred embodiments of the present invention will be described. FIGS. 1 and 2 illustrate an example of information cards to which the present invention relates. An information card 1 is constituted by a card base 10, a metallic casing 12 disposed or embedded in an opening 11 which is formed at a suitable location in the card base 10, one or more semiconductor chips enclosed in the metallic casing 12, and other members related thereto. The card base 10 is made of a plastic material or the like, and is covered at its front and back surfaces by cover films 13, 14 respectively. The metallic casing 12 is made of an electrically conductive material such as a copper plate or the like. It should however be noted that the term "metallic casing 12" embraces in this specification a casing in which only the bottom wall thereof is made of a metallic material and its peripheral wall is made of a non-metallic material such as ceramics. In the illustrated embodiment, the opening 11 and metallic casing 12 are both formed into rectangular shapes in plan. Needless to say, they may however be formed into circular shapes or any other suitable shapes.

Figure 3:
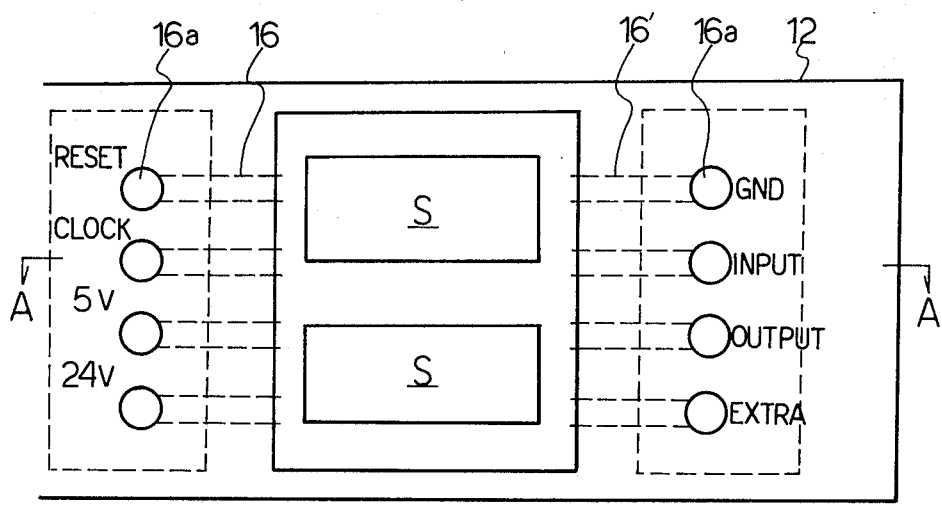
FIG. 3 is a fragmentary plan view of an information card according to one embodiment of this invention.
Figure 4:
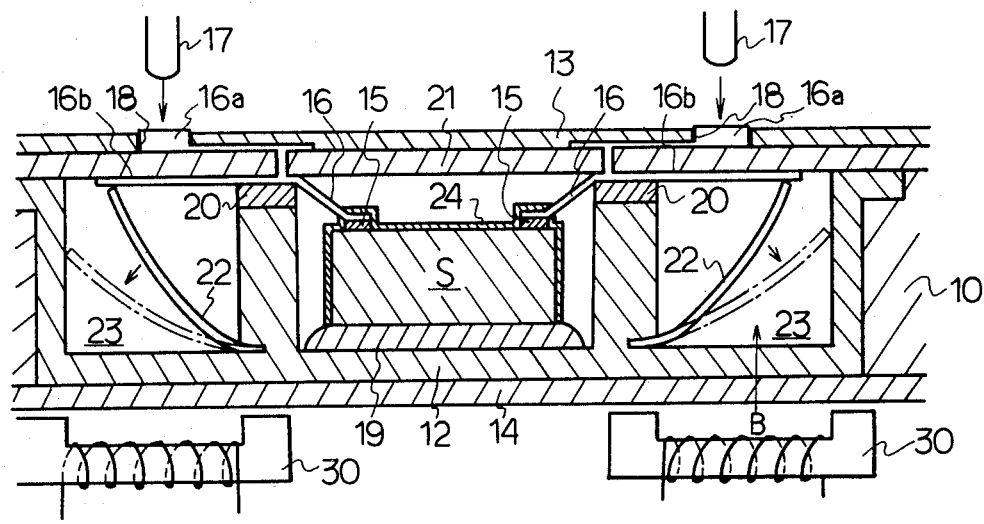
FIG. 4 is a cross-sectional view taken along line A—A of FIG. 3.
Figure 5:
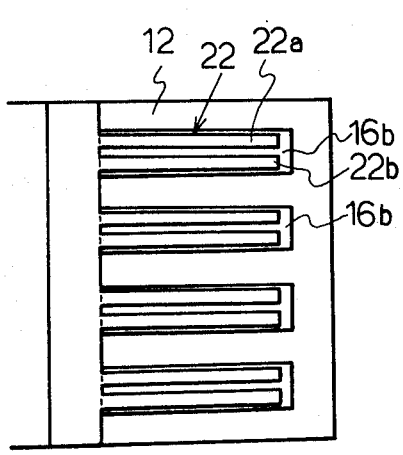
FIG. 5 is a bottom plan view seen in the direction indicated by "B" in FIG. 4.

FIGS. 3 through 5 depict an embodiment of this invention. In this embodiment, two semiconductor chips S are disposed in the metallic casing 12, one of which is used as a microprocessor to make a verification of the card holder and also to protect the data and program, which are used for the processing of transactions, from any unauthorized alteration, and the other of which is employed as a memory. These semiconductor chips S are fixedly secured on the bottom wall of the metallic casing 12 through an electrically-conductive paste 19. In the illustrated embodiment, conductor strips 16 extending from their corresponding eight contacts 15 of the semiconductor chips S are designed to be brought into contact with their corresponding signal input/output terminals 17, which are provided separately from the information card 1. Thus, the front cover film 13 defines, at locations corresponding to the conductor strips 16, apertures 18 in which their respective contacts 16a are buried with their tops protruding upwardly. The contacts 16a may be formed either integrally with or separately from their corresponding conductor strips 16.

As illustrated in FIG. 4, the interior of the metallic casing 12 is suitably partitioned. The semiconductor chips S are arranged in the middle section of the interior. The conductor strip 16 from each contact 15 is made of a thin strip-like material such as for example a copper foil and fixedly secured to a given location of the metallic casing 12 through an insulative material 20 such as a polyimide film. In this embodiment, each conductor strip 16 is bifurcated into an upper part and lower part 16b with an insulation layer 21 therebetween. The upper part carries the contact 16a. Furthermore, an elastic member, preferably, a leaf spring 22 is provided in a cavity 23 formed in the metallic casing 12 at a location corresponding to each of the conductor strips 16. The leaf spring 22 is made of a magnetic material and fixedly secured at its one end to the metallic casing 12, while the other, i.e., free end of the leaf spring 22 is kept in contact with a lower part 16b of its corresponding conductor strip 16. Thus, when the information card 1 is not used, each conductor strip 16 is electrically connected through its corresponding leaf spring 22 to the metallic casing 12, whereby connecting all the conductor strips 16 to one another.

When each of the leaf springs 22 is attracted by a magnet 30 (see, FIG. 4) provided in a signal input/output unit, its free end is caused to move away from the lower part 16b of its corresponding conductor strip 16 as shown by a phantom line in FIG. 4. Each leaf spring 22 may be formed of a single piece of strip. However, it is preferred to make each leaf spring 22 by a pair of strips 22a, 22b which are disposed parallelly to each other as shown in FIG. 5, whereby contemplating to improve the reliability of the leaf spring still further. On the other hand, the magnet 30 may preferably be an electromagnet but a permanent magnet may also be used as the magnet 30. In the drawing, numeral 24 indicates a glass passivation film which encloses the semiconductor chips S.

When the information card 1 is placed on a prescribed position of the signal input/output unit to activate same, each leaf spring 22 is attracted by the magnet 30 downwardly in FIG. 4 since it is made of the magnetic material and is thus displaced apart from its corresponding conductor strip 16. Thus, each conductor strip 16 is isolated from the other conductor strips and forms an independent circuit. Then, the signal input/output terminals 17 descend to contact the contacts 16a of their corresponding conductor strips 16, thereby carrying out a prescribed operation.

In addition, a specific conductor strip, for example a conductor strip 16' at a position designated by "GND" in FIG. 3 is always grounded. Therefore, it is not necessary to provide any leaf spring 22 at the same position. The conductor strip 16' is connected to the metallic casing 12 by means of a suitable conductor. Incidentally, "CLOCK", "24V" and "EXTRA" in FIG. 3 indicate respectively a conductor strip for a power supply of the semiconductor device, a conductor strip for a power supply for writing-in, reading-out, erasure, etc. of information stored, and a space terminal.

Figure 6:
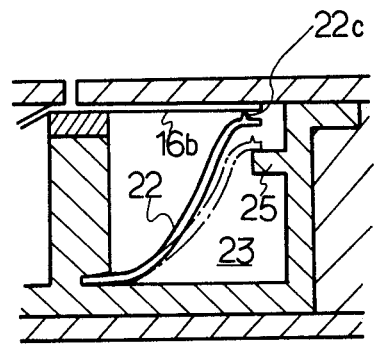
FIG. 6 is a fragmentary cross-sectional view of a leaf spring according to another embodiment of this invention and its related parts.

Although the contact 16a of each conductor strip 16 is buried in its corresponding aperture 18 formed in the cover film 13 in the above embodiment, it may be possible in some instances to permit the signal input/output terminals 17 to extend through the apertures 18 and to contact the conductor strips 16 directly without providing such contacts, as shown in FIG. 7. It is preferred to provide, as illustrated in FIG. 6, a stopper 25 in each cavity 23 of the metallic casing 12 so as to limit the displacement of its respective leaf springs 22. This stopper 25 may take the form of a rib as shown in FIG. 6. Alternatively, it is also feasible to make up each stopper 25 by a step. In the above embodiment, leaf springs are used as the elastic members 22. Needless to say, the elastic members 22 shall not be limited to leaf springs only but coil springs 22 may also be used as the elastic members 22 as depicted in FIG. 7. Here, it is preferred that a projection 22c is provided at an upper free end portion of each coil spring 22 in order to improve its contact with its corresponding conductor strip 16.

In an information card according to this invention, each conductor strip 16 constitutes an independent circuit while it is in use. However, all the conductor strips 16 are electrically connected to the metallic casing when they are not in use, thereby connecting the conductor strips together and maintaining them at the same potential. Owing to this feature, the semiconductor chips will not be affected by electrostatic energy and can thus be protected from electrostatic breakdown even if the information card is subjected to such electrostatic energy due to its rubbing or the like.

Therefore, it will be possible to provide information cards of extremely high utility when the present invention is applied to information cards containing one or more semiconductor chips of the MOS-type structure.

Having now fully described the invention, it will be apparent to one of ordinary skill in the art that many changes and modifications can be made thereto without departing from the spirit or scope of the invention as set forth herein.

What is claimed is:

1. In an information card having an opening, and including a metallic casing disposed in the opening, at least one semiconductor chip having contacts and seated in the metallic casing, and a conductor strip extending from each of the contacts to a location where each strip can be brought into contact with a signal input/output terminal of a separate signal input/output unit, the improvement comprising the metallic casing having a cavity, an elastic member provided in said cavity at a location corresponding to each conductor strip and fixedly secured to the metallic casing at one end thereof, and a free end of each elastic member being biased into contact with its corresponding conductor strip while the information card is unused and said elastic member being attracted by a magnet in the signal input/output unit to cause its free end to separate from its corresponding conductor strip once the information card is used, each elastic member being made of magnetic material throughout its length.

2. The information card as claimed in claim 1, wherein said elastic member is a magnetic leaf spring.

3. The information card as claimed in claim 2, wherein said magnetic leaf spring comprises a pair of magnetic strips disposed parallelly to each other.

4. The information card as claimed in claim 2, further comprising a stopper provided in said cavity of said metallic casing so as to limit the displacement of said leaf spring.

5. The information card as claimed in claim 1, wherein said elastic member is a magnetic coil spring.

6. The information card as claimed in claim 2, wherein the information card includes an insulation layer extending over the opening and the metallic casing, each conductor strip having an upper part extending above said insulation layer for being brought into contact with the signal input/output terminal, and a lower part extending below said insulation layer and into said cavity for coming into contact with said free end of said elastic member.

7. The information card as claimed in claim 2, wherein said elastic member includes a projection at its free end for contacting its corresponding conductor strip.

8. The information card as claimed in claim 5, wherein said elastic member includes a projection at its free end for contacting its corresponding conductor strip.

9. The information card as claimed in claim 4, wherein said elastic member includes a projection at its free end for contacting its corresponding conductor strip.

10. The information card as claimed in claim 6, wherein each upper part of each conductor strip includes a projecting contact portion, the information card including a cover layer extending over said insulation layer with an aperture for receiving each projecting contact portion.

* * * * *